United States Patent
Miyokawa

(10) Patent No.: US 10,101,547 B2
(45) Date of Patent: Oct. 16, 2018

(54) FIXING STRUCTURE FOR OPTICAL FIBER, SEMICONDUCTOR LASER MODULE, AND FIXING METHOD FOR OPTICAL FIBER

(71) Applicant: FURUKAWA ELECTRIC CO., LTD., Tokyo (JP)

(72) Inventor: Jun Miyokawa, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/742,600

(22) Filed: Jun. 17, 2015

(65) Prior Publication Data

US 2015/0286015 A1    Oct. 8, 2015

Related U.S. Application Data

(63) Continuation of application No. PCT/JP2013/077242, filed on Oct. 7, 2013.

(30) Foreign Application Priority Data

Dec. 21, 2012  (JP) .................................. 2012-279409
Apr. 16, 2013  (JP) .................................. 2013-085392

(51) Int. Cl.
*G02B 6/42*    (2006.01)
*H01S 5/022*   (2006.01)
*H01S 5/00*    (2006.01)

(52) U.S. Cl.
CPC ........... *G02B 6/4239* (2013.01); *G02B 6/424* (2013.01); *G02B 6/4243* (2013.01);
(Continued)

(58) Field of Classification Search
CPC .................. G02B 6/3889; G02B 6/4239
See application file for complete search history.

(56) References Cited

U.S. PATENT DOCUMENTS 5,210,811 A      5/1993  Avelange et al.
5,985,086 A  *  11/1999  Peall ..................... B29C 65/548
                                                  156/292

(Continued)

FOREIGN PATENT DOCUMENTS

JP     61-143111     9/1986
JP     63-205978     8/1988
(Continued)

OTHER PUBLICATIONS

Kaneko, Machine Translation of JP 2000-162467 A, Jun. 2000.*

(Continued)

*Primary Examiner* — Michelle R Connelly
(74) *Attorney, Agent, or Firm* — Marshall, Gerstein & Borun LLP

(57) ABSTRACT

This fixing structure for an optical fiber comprises a groove provided to a fiber-fixing base along the axial direction of an optical fiber to be fixed. The groove opens upward. The optical fiber is arranged within the groove along the groove. The optical fiber is fixed to the inner surface of the groove using an adhesive. The inner-side surfaces of the groove that face each other serve as fixing surfaces for the optical fiber. In other words, the optical fiber is fixed to the fixing surfaces that are the inner-side surfaces of the groove and that face each other using the adhesive. A space in which the fiber-fixing base and the adhesive are not bonded is formed in the vertical direction of the optical fiber. In other words, a space is provided in a vertical direction that is substantially perpendicular to the fixing direction in which the optical fiber is fixed.

8 Claims, 12 Drawing Sheets

(52) U.S. Cl.
CPC ........ *G02B 6/4257* (2013.01); *H01S 5/02284* (2013.01); *G02B 6/4203* (2013.01); *G02B 6/4204* (2013.01); *G02B 6/4208* (2013.01); *H01S 5/005* (2013.01); *H01S 5/0064* (2013.01); *H01S 5/02252* (2013.01); *H01S 5/02288* (2013.01)

(56) References Cited

U.S. PATENT DOCUMENTS

| | | | | |
|---|---|---|---|---|
| 6,896,422 | B2* | 5/2005 | Bennett | G02B 6/421 385/88 |
| 2002/0015567 | A1* | 2/2002 | Goldman | G02B 6/3833 385/91 |
| 2002/0021875 | A1 | 2/2002 | Tateno et al. | |
| 2002/0037142 | A1 | 3/2002 | Rossi | |
| 2002/0197021 | A1 | 12/2002 | Kusunoki | |
| 2003/0021574 | A1 | 1/2003 | Inokuchi et al. | |
| 2011/0051454 | A1* | 3/2011 | Wolf | G02B 6/3636 362/553 |
| 2012/0027352 | A1 | 2/2012 | Taniguchi et al. | |

FOREIGN PATENT DOCUMENTS

| | | |
|---|---|---|
| JP | 01-116607 | 5/1989 |
| JP | 02-308101 | 12/1990 |
| JP | 6-88923 | 3/1994 |
| JP | 2000162467 A * | 6/2000 |
| JP | 2002-107586 A | 4/2002 |
| JP | 2002-202443 A | 7/2002 |
| JP | 2003-4989 | 1/2003 |
| WO | WO-2010/106978 A1 | 9/2010 |

OTHER PUBLICATIONS

Kaneko et al., Machine Translation of JP 2000-162467 A, Jun. 16, 2000.*

Office Action for Japanese Patent Application No. 2013-085392, dated May 13, 2014.

International Search Report for PCT/JP2013/077242, dated Nov. 12, 2013.

* cited by examiner

-Prior Art-

-Prior Art-

-Prior Art-

-Prior Art-

-Prior Art-

US 10,101,547 B2

FIXING STRUCTURE FOR OPTICAL FIBER, SEMICONDUCTOR LASER MODULE, AND FIXING METHOD FOR OPTICAL FIBER

CROSS-REFERENCE TO RELATED APPLICATIONS

This application is a continuation, and claims the benefit of priority, of International Patent Application No. PCT/JP2013/077242, filed Oct. 7, 2013, and entitled "Fixing Structure For Optical Fiber, Semiconductor Laser Module, And Fixing Method For Optical Fiber," which claims the benefit of priority of Japanese Patent Application No. 2013-085392, filed Apr. 16, 2013, and of Japanese Patent Application No. 2012-279409, filed Dec. 21, 2013, each of which is incorporated herein by reference in its entirety and for all purposes.

TECHNICAL FIELD

This disclosure relates to a fixing structure for an optical fiber that can prevent the position-shifting of the optical fiber and can stably fix the optical fiber, a semiconductor laser module, and a fixing method for an optical fiber.

BACKGROUND

In a conventionally used semiconductor laser module, a laser diode (semiconductor laser) chip is optically coupled with an optical fiber. In this case, the optical axis of the optical fiber is aligned with that of the semiconductor laser and then the optical fiber is fixed onto a base using solder, adhesive, or the like.

FIG. 10 is a schematic view showing a conventional semiconductor laser module 100. The semiconductor laser module 100 has a semiconductor laser base 105 and a fiber-fixing base 109 that are arranged on a base 103 in alignment. A semiconductor laser 107 is fixed onto the semiconductor laser base 105. Also, an optical fiber 113 is fixed to the fiber-fixing base 109 using adhesive 111 or the like. In this state, the optical fiber 113 and the semiconductor laser 107 are optically coupled. Hereinafter, a fixing structure for an optical fiber and a fiber-fixing base will be called as a fixing structure for an optical fiber.

FIG. 11 (a) and FIG. 11 (b) show a fixing structure 110 for an optical fiber in the semiconductor laser module 100 wherein FIG. 11 (a) is a side view and FIG. 11 (b) is a front view. As shown in FIG. 11 (a), the adhesive 111 is provided over the fiber-fixing base 109 having a flat upper surface so that the adhesive 111 rises up with surface tension, so that the optical fiber 113 is fixed with the adhesive 111.

In the fixing structure 110 for an optical fiber, only the lower part of the optical fiber 113 is fixed to the fiber-fixing base 109. That is, only one side of the optical fiber 113 is fixed to the fiber-fixing base 109. In this case, if force is given at the rear side of the fixed part of the optical fiber 113 in its axial direction (the direction shown with an arrow G in the drawing), position-shifting occurs in the rotational direction causing the tip of the optical fiber 113 shifting upward or downward (the directions shown with arrows H in the drawing).

Also, as shown in FIG. 11 (b), in such a structure as the optical fiber fixing structure 110, force is given to the optical fiber 113 in the direction toward the fiber-fixing base 109 (the directions shown with arrows I in the drawing) due to the contraction of the adhesive 111 at the time of curing.

Thus, it is likely that the position of the optical fiber 113 with regard to the fiber-fixing base 109 may change later after alignment.

Such shifting in the position of an optical fiber becomes a major problem particularly in a case of a single mode lensed fiber. That is, in a semiconductor laser module using an optical coupling system with especially narrow coupling tolerance such as the single mode lensed fiber, such an occurrence of shifting in the position causes a displacement of the optical coupling state between the semiconductor laser and the optical fiber and deteriorates the fiber-end output of the semiconductor laser module.

Particularly in a case in which a wedge lensed fiber with a wedged-shaped tip such as an optical fiber used in an optical coupling with a semiconductor laser having a wavelength range of around 980 nm is used, the optical coupling tolerance in the vertical height direction is extremely narrow due to the optical coupling properties thereof. Therefore, deterioration of the fiber-end output is even a larger problem.

On the other hand, there is a method to fix the optical fiber 113 to the fiber-fixing base by providing a groove or a hole on the fiber-fixing base, disposing the optical fiber 113 in the groove or the hole, and then filling the groove or the hole with adhesive.

FIG. 12 (a) shows a fixing structure for an optical fiber 110a using a fiber-fixing base 109a with a groove having an approximately rectangular cross-section. The fixing structure for an optical fiber 110a has an optical fiber 113 disposed in the groove which is formed on the fiber-fixing base 109a, and adhesive 111 filled into the groove fixes the optical fiber 113 to the fiber-fixing base 109a.

However, although the optical fiber 113 in the fixing structure for an optical fiber 110a is fixed to the fiber-fixing base 109a in the three directions: left, right, and downward, against the rectangular groove, even so, the optical fiber 113 still receives stress in the right, left, and downward directions (directions shown by arrows J in the drawing) due to the contraction of the adhesive 111 at the time of curing. Therefore, the position of the tip of the optical fiber 113 may be shifted when the adhesive is cured.

Also, FIG. 12 (b) shows a fixing structure for an optical fiber 110b using a fiber-fixing base 109b having a circular hole. The fixing structure for an optical fiber 110b has the optical fiber 113 inserted through the hole formed on the fiber-fixing base 109b and the adhesive 111 filled in the hole fixes the optical fiber 113 to the fiber-fixing base 109b.

In the fixing structure for an optical fiber 110b, the optical fiber 113 in the hole receives approximately uniform stress in all directions (shown by the arrows K in the drawing) at the time of curing contraction of the adhesive 111. However, the surface of the optical fiber 113 is pulled toward all the directions at the curing contraction of the adhesive 111 and compressive stress is given. Also, temperature change after the adhesion causes expansion or contraction of the adhesive which leads to compressive or tension stress to be given to the whole circumference of the optical fiber 113. In such a case, since whole circumference of the adhesive is restricted by the hole, the stress cannot be released, causing problems such as the adhesive 111 detaching from the fiber-fixing base 109b or the surface of the optical fiber 113, or cracking of the surface of the fiber-fixing base 109a.

SUMMARY

The presently described embodiments are achieved in view of such problems. The object is to provide a fixing structure for an optical fiber that can prevent the position-shifting of the optical fiber and can stably fix the optical fiber and the like.

To achieve the above object, a fixing structure for an optical fiber is provided, comprising a base and an optical fiber fixed with a fixing member to the base, wherein a groove is formed on the base along the axis direction of the optical fiber, the optical fiber is fixed to fixing surfaces that are inner sides of the groove facing each other with the fixing member, and space parts, in which the optical fiber is not fixed to the base, are formed on both directions that are approximately perpendicular, when viewed from the axial direction of the optical fiber, to the fixing direction of the optical fiber and the fixing surfaces.

The groove is formed on a upper surface of the base, the optical fiber is fixed to the fixing surfaces that are inner sides of the groove facing each other with the fixing member, and a space-varying part having a space varied from the space between the two fixing surfaces at the part in which the optical fiber is fixed may be formed on the bottom side of the groove.

A plurality of the grooves may be provided along the axial direction of the optical fiber and the length of the groove on the near side of the tip of the optical fiber may be shorter than the length of the groove on the far side of the tip of the optical fiber.

According to some embodiments, the optical fiber is fixed with the fixing member to the facing surfaces of only one side of the groove that is formed on the base. Also, in the directions perpendicular the to fixing direction of the optical fiber, space parts, in which the base and the optical fiber are not fixed, are formed. Thus, the force due to contraction of the adhesive is cancelled out, preventing the optical fiber from position-shifting. Also, since the space parts are formed, the space parts become clearance parts for the changes in shapes at the time of expansion or contraction of the adhesive. Therefore, it is possible to prevent excessive force to be given to the periphery of the optical fiber.

Also, when the optical fiber is fixed and supported by the fixing surfaces in a horizontal direction, forming a space-varying part, in which the space inside the groove is varied, at the lower part can prevent the adhesive before curing from flowing downward. Therefore, it is possible to prevent the adhesive from flowing downward and to prevent the groove from being filled with the adhesive as shown in FIG. 12 (a).

Also, forming a plurality of grooves along the axial direction of the optical fiber and separating the grooves into a short groove part, which is on the tip side of the optical fiber, and a long groove part, which is on the other side, can fix the optical fiber to the base more accurately. For example, since small amount of the adhesive used is required to fix the optical fiber in the short groove, the influence of position-shifting due to the adhesive can be suppressed. On the other hand, since small amount of adhesive is not enough to gain sufficient fixing strength, the optical fiber is fixed in the long groove so that sufficient fixing strength can be secured.

In another embodiment, a semiconductor laser module having the fixing structure for an optical fiber according to the first embodiment, comprising a base, the fixing structure for an optical fiber provided on the base, and a semiconductor laser that is optically coupled with the optical fiber in the fixing structure for an optical fiber.

A lens and an isolator may be provided between the semiconductor laser and the optical fiber.

According to some embodiments, it is possible to obtain a semiconductor laser module with small shifting in position in the optical coupling between the optical fiber and the semiconductor and less deterioration in fiber-end output.

In yet another embodiment, a method for fixing an optical fiber comprises the steps of disposing the optical fiber in a groove on a base having the groove, applying a fixing member between the optical fiber and fixing surfaces that are inner sides of the groove facing each other, and curing the fixing member to fix the optical fiber to the base, wherein the optical fiber is fixed so that space parts, in which the optical fiber is not fixed to the base, are formed on both directions that are approximately perpendicular, when viewed from the axial direction of the optical fiber, to the fixing direction of the optical fiber and the fixing surfaces.

The length of a first groove, which is on the near side of the tip of the optical fiber, may be shorter than the length of a second groove, which is on the far side of the tip of the optical fiber. The method may comprise the steps of applying the fixing member between the optical fiber and the fixing surfaces of the first groove, curing the fixing member in the first groove to fix the optical fiber to the base, applying the fixing member between the optical fiber and the fixing surfaces of the second groove, and curing the fixing member in the second groove to fix the optical fiber to the base, wherein the optical fiber may be fixed in the first groove and the second groove so that space parts, in which the optical fiber is not fixed to the base, are formed on both directions that are approximately perpendicular, when viewed from the axial direction of the optical fiber, to the fixing direction of the optical fiber and the fixing surfaces.

According to some embodiments, it is possible to easily obtain a semiconductor laser module with small shifting in position in the optical coupling between the optical fiber and the semiconductor and less deterioration in fiber-end output.

Also, for the plurality of grooves formed along the axis direction of the optical fiber, since the optical fiber is fixed to the short groove first hence the position close to the tip of the optical fiber can be fixed with small amount of adhesive, the influence of the position-shifting due to the adhesive can be suppressed. Also, since the optical fiber is fixed to the longer groove after fixing to the shorter groove is completed, sufficient fixing strength can be secured.

The presently described embodiments can provide a fixing structure for an optical fiber that can prevent the position-shifting of the optical fiber and can stably fix the optical fiber and the like.

BRIEF DESCRIPTION OF DRAWINGS

FIG. 1 (b) shows a variation of the semiconductor laser module.

FIG. 3 (b) is an enlarged view of A part in FIG. 3 (a).

FIG. 4 (b) is a fixing structure for an optical fiber having a space-varying part.

FIG. 4 (c) is a fixing structure for an optical fiber having a space-varying part.

FIG. 8 (b) shows a semiconductor laser module.

FIG. 11 (*b*) is a front view showing the conventional fixing structure for an optical fiber.

FIG. 12 (*b*) is a front view of a conventional fixing structure for an optical fiber.

DETAILED DESCRIPTION

Figure 1A:
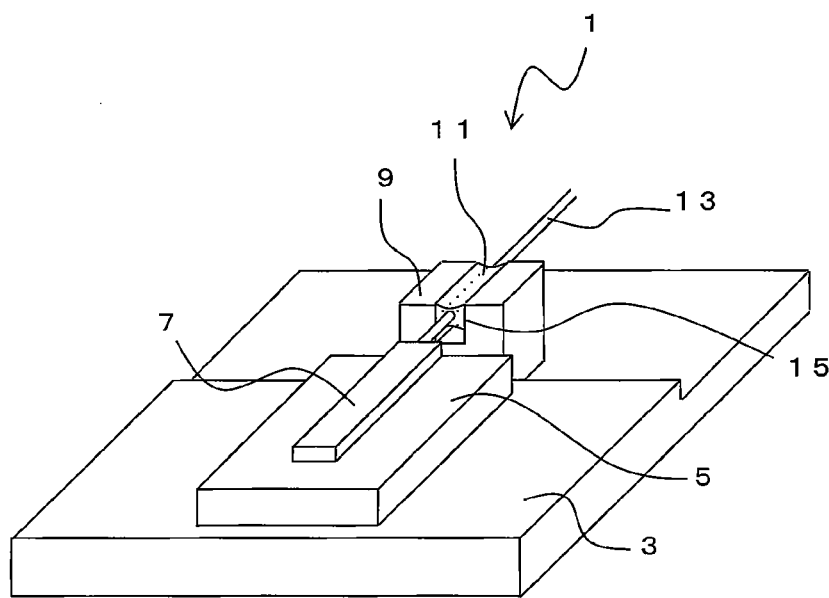
FIG. 1 (a) shows a semiconductor laser module.
Figure 1B:
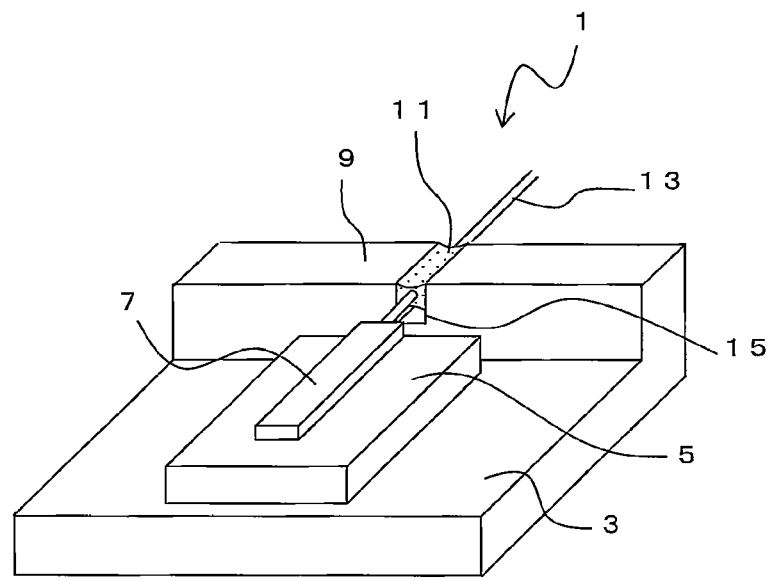

Hereinafter, embodiments will be described with reference to the accompanying drawings. FIG. 1 (*a*) is a perspective view of a semiconductor laser module 1. The semiconductor laser module 1 mainly comprises a base 3, a semiconductor laser base 5, a semiconductor laser 7, a fiber-fixing base 9, an optical fiber 13, and the like.

The base 3 is a plate like member on which all of the components are disposed. AlN, CuW, $Al_2O_3$, or the like can be used for the base 3 for example, and it is preferable that the material for the base 3 is excellent in thermal conductivity.

On the base 3, the semiconductor laser base 5 is fixed with solder and the like. The semiconductor laser base 5 is a member on which the semiconductor laser 7 is fixed. AlN, CuW, Cu, Si, or the like can be used for the semiconductor laser base 5 for example, and, also, the semiconductor laser 7 can emit a laser at a desired wavelength. For example, InP laser, GaAs laser, GaAsAl laser, or the like can be used.

Figure 2:
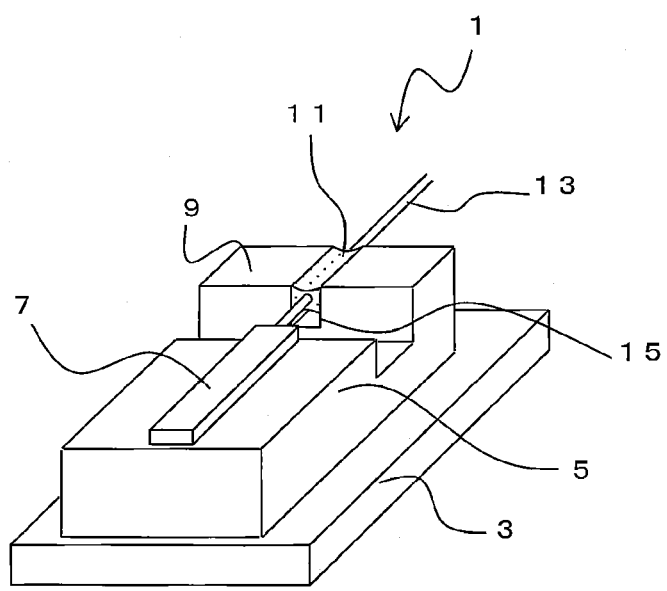
FIG. 2 shows another variation of the semiconductor laser module.

On the base 3, the fiber-fixing base 9 is fixed with solder, adhesive, or the like so to be aligned with the semiconductor laser base 5. For the fiber-fixing base 9, glass materials such as borosilicate glass or silica glass, or AlN, CuW, $Al_2O_3$, or the like can be used for example. As shown in FIG. 1 (*b*), it is possible to form the fiber-fixing base 9 and the base 3 integrally. Also, as shown in FIG. 2, the semiconductor laser base 5 and the fiber-fixing base 9 may be formed integrally. In this case, the integrally formed base is fixed onto the base 3 with solder and the like. Here, as shown in FIG. 2, the base 3 is not necessarily required if the semiconductor laser base 5 and the fiber-fixing base 9 are integrally formed. Hereinafter, the description will be made for an example in which the fiber-fixing base 9 and the base 3 are formed separately with the fiber-fixing base 9 being bonded onto the base 3.

On the upper surface of the fiber-fixing base 9, the optical fiber 13 is fixed with the adhesive 11. As the adhesive 11, UV curing adhesive, thermosetting adhesive, a combination of UV curing and thermosetting adhesive, normal-temperature curing adhesive, or the like can be used for example. In this state, the optical fiber 13 and the semiconductor laser 7 are optically coupled. For the fixing member to fix the optical fiber 13, solder may be used instead of the adhesive 11. In this case, solder material such as AuSn, SnAgCu, SnBi, or the like can be used. Although the description below will be made for an example in which the adhesive 11, which cures and contracts, is used as the fixing member, the same effects are obtained with the solidification contraction in the case in which solder is used.

To align the optical fiber 13 and the semiconductor laser 7, the optical fiber 13 is relatively moved to the semiconductor 7 with light emitted from the semiconductor laser 7 entering into the optical fiber 13, for example. The optical fiber 13 is moved by a hand (not shown in the drawing) chucking the optical fiber 13. The positioning is performed so that the light intensity detected by a photo detector is at the maximum and the operation of positioning is finished with the state in which the intensity larger than predetermined intensity is detected. In this state, the adhesive 11 is cured by irradiating heat, ultraviolet ray or the like to the adhesive 11. As above, the optical fiber 13 is fixed to the fiber-fixing base 9 at an appropriate position.

Figure 3A:
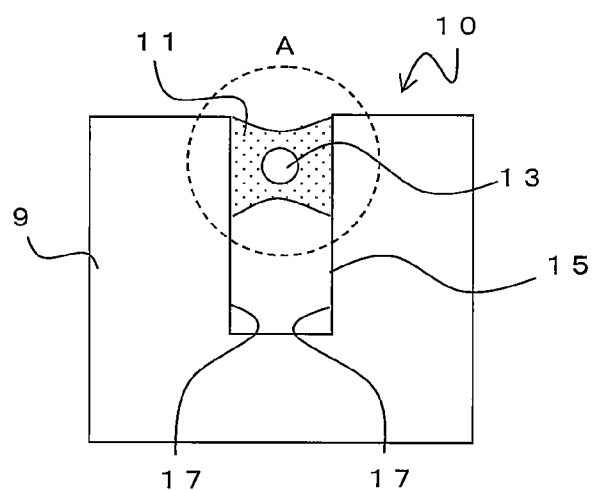
FIG. 3 (a) shows a fixing structure for an optical fiber.
Figure 3B:
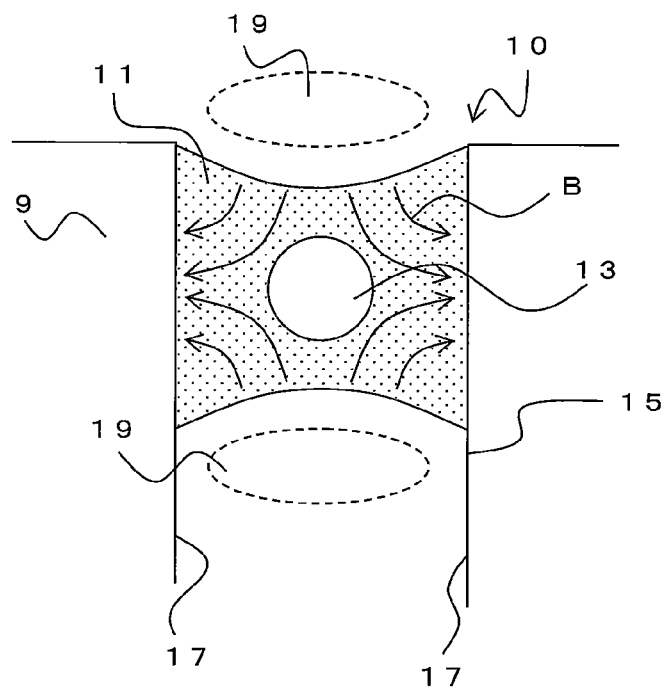

FIG. 3 (*a*) and (*b*) are schematic views of a fixing structure for an optical fiber 10 where FIG. 3 (*a*) is an elevated view and FIG. 3 (*b*) is an enlarged view of A part in FIG. 3 (*a*). A groove 15 is provided on the fiber-fixing base 9 along the axial direction of the optical fiber 13 which is to be fixed. The groove 15 opens upward. The optical fiber 13 is disposed inside the groove 15 along the groove 15.

The optical fiber 13 is fixed to the inner surfaces of the groove 15 with the adhesive 11. On this occasion, the inner side surfaces of the groove 15 that face each other serve as fixing surfaces 17 of the optical fiber 13. That is, the optical fiber 13 is fixed to the fixing surfaces 17 that are the inner side surfaces of the groove 15 and that face each other using the adhesive 11.

At this time, as shown in FIG. 3 (*b*), spaces 19, in which the adhesive 11 is not adhered to the fiber-fixing base 9, are formed in the vertical direction of the optical fiber 13. That is, the spaces 19 are provided in the vertical direction that is substantially perpendicular to the fixing direction in which the optical fiber 13 is fixed.

For the optical fiber 13, a lensed fiber of 125 µm can be used for example. In this case, the width of the groove 15 (the distance between the fixing surfaces 17 in the fixing direction of the optical fiber 13 which is the horizontal direction in FIG. 3 (*b*)) is approximately between 200 µm and 500 µm for example. If the width of the groove 15 is too large, the adhesive 11 may tend to flow down to the lower part and fill up the lower space. Also, if the width of the groove 15 is too narrow, the alignment width of the optical fiber 13 becomes narrower.

As shown in FIG. 3 (*b*), contraction force due to curing is given to the adhesive 11. This force is given in the direction from the surface of the adhesive 11 toward the fixing surfaces 17 (shown by arrows B in the drawing). In this embodiment, the optical fiber 13 is pulled toward directions of both of the fixing surfaces 17. Therefore, the force in the directions toward the fixing surfaces 17 (horizontal direction) approximately cancels each other preventing the position-shifting of the optical fiber 13 in the horizontal direction at the time of curing contraction of the adhesive 11. On the other had, approximately the same force is given in the vertical direction of the optical fiber 13 and the optical fiber 13 is not pulled toward only one direction. Therefore, the position-shifting of the optical fiber 13 in the vertical direction can be prevented at the time of curing contraction of the adhesive 11. On this occasion, the adhesive 11 in the vertical direction of the optical fiber is compensates the contraction of the adhesive 11 in the horizontal direction (in the direction of the fixing surfaces 17). Therefore, no excessive tension is given to the surfaces of the optical fiber 13.

Thus, since the optical fiber 13 is fixed only to the fixing surfaces 17 that faces each other and the spaces 19 are provided in the perpendicular directions thereof, the optical fiber 13 and the fiber-fixing base 9 are not bonded in the directions of the spaces 19. Therefore, when the adhesive 11 contracts, each of the stress occurring in the vertical and horizontal directions is symmetric, preventing the optical fiber 13 from position-shifting.

The depth of the groove 15 is deep enough in regard to the width of the groove 15 (for example, the depth is 1.5 times the width or more). If the depth of the groove 15 is too shallow, the adhesive 11 flows and adhere to the bottom surface of the groove 15, making it difficult to appropriately form the spaces 19. Also, the viscosity of the adhesive 11 is preferably between 10 Pa/s and 200 Pa/s, for example, and more preferably between 15 Pa/s and 100 Pa/s. If the viscosity of the adhesive 11 is too low, the adhesive 11 tends to flow downward. Also, if the viscosity of the adhesive 11 is too high, it is difficult to align the optical fiber. Such adjustment of the viscosity can be done by adjusting the content of the filler for example. If the filler content is high, the viscosity can be raised. Also, containing the filler can decrease the amount of contraction of the adhesive 11 at the time of curing.

Figure 4A:
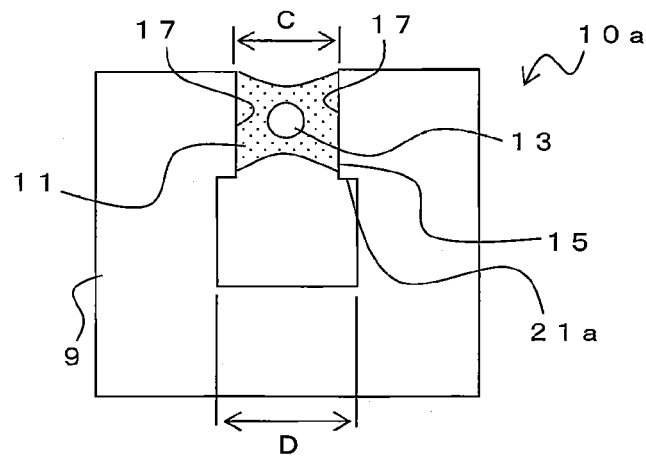
FIG. 4 (a) is a fixing structure for an optical fiber 10a having a space-varying part.
Figure 4B:
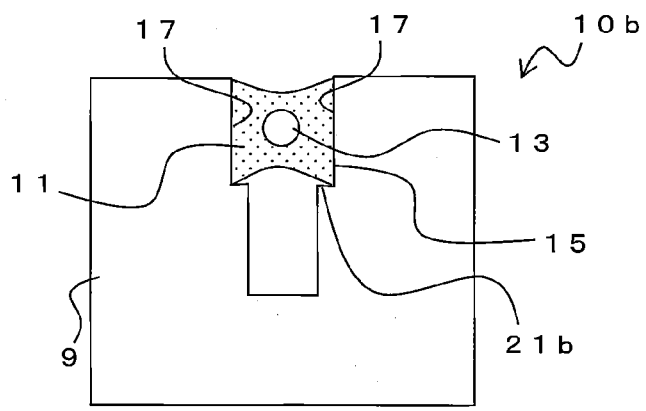
Figure 4C:
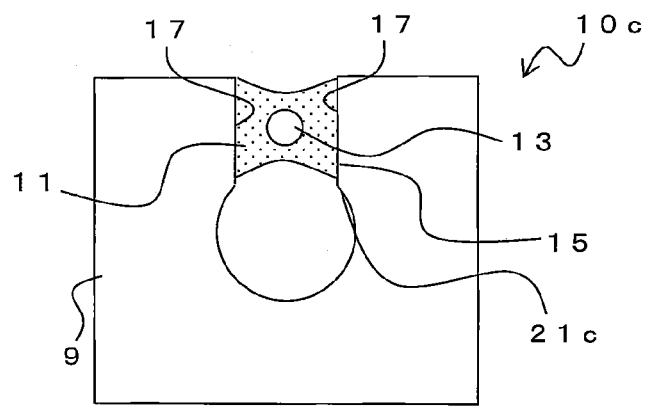

As shown in FIG. 4 (a), it is also possible to structurally prevent the adhesive 11 from flowing downward. The groove 15 in a fixing structure for an optical fiber 10a has width that varies with positions. Specifically, a width C at the fixing part in which the optical fiber 13 and the fiber-fixing base 9 are fixed with the adhesive 11 (the distance between the fixing surfaces 17) is smaller than a width D that is under the fixing part. That is, a level difference is formed at the lower part of the fixing surfaces 17 by a space-varying part 21a. Thus, by making the lower part of the fixing surfaces 17 to which the adhesive 11 is applied the level difference instead of a straight line, the adhesive 11 can be prevented from flowing downward.

Such effects can be obtained in a fixing structure for an optical fiber 10b shown in FIG. 4 (b). In the fixing structure for an optical fiber 10b, the width of the fixing part in which the optical fiber 13 and the fiber-fixing base 9 are fixed with the adhesive 11 (the distance between the fixing surfaces 17) is larger than a groove width that is under the fixing part. That is, a level difference is formed at the lower part of the fixing surfaces 17 by a space-varying part 21b. Thus, independent of the forming direction of the level difference, changing the distance can prevent the adhesive 11 from flowing downwardly from the fixing surfaces 17. The level difference, for example, is preferably 0.1 mm or more.

Such effects can also be obtained in a fixing structure for an optical fiber 10c shown in FIG. 4 (c). In the fixing structure for an optical fiber 10c, the lower part of the fixing surfaces 17 is formed circularly. In this case, the width of the groove also varies by a space-varying part 21c at the lower part of the fixing surfaces 17. Thus, the adhesive 11 can be prevented from flowing downwardly from the fixing surfaces 17 if a varied part of the width of the groove 15, independent of its shape, is formed under the fixing surfaces 17.

Also, roughening the surface roughness of the fixing surfaces 17 by processing the adhered surface part of the fixing surfaces 17 with adhesive or the entire fixing surfaces 17 into frosted glass can enhance the effects of surface tension of the adhesive so that the adhesive can be prevented from flowing downwardly. In this case, the surface roughness of the fixing surfaces 17 represented by the center line average roughness (Ra) is preferably between 0.8 μm and 25.0 μm, and, more preferably, between 1.0 μm and 12.5 μm.

As described above, according to the present embodiment, since the optical fiber 13 is fixed at a pair of the fixing surfaces 17 that faces each other, the forces due to curing contraction of the adhesive 11 applied in each direction of the fixing surfaces 17 is cancelled so to prevent the position-shifting of the optical fiber 13 in horizontal directions. Also, since the optical fiber 13 is fixed with lateral symmetry (vertical symmetry) on the fiber-fixing base 9 when viewed from the front, shifting in the rotational direction in vertical and horizontal directions occurring at the tip of the optical fiber 13 can be prevented even if the optical fiber 13 is pulled from the rear.

Also, the spaces 19 are provided in the vertical directions of the optical fiber 13 and the tension by the contraction of the adhesive 11 is vertically symmetric. Therefore, the position-shifting of the optical fiber 13 in vertical directions can be prevented. On this occasion, the surfaces of the adhesive 11 at the spaces 19 compensate the contraction of the adhesive 11 so that no excessive tension is given to the surfaces of the optical fiber 13 and the vicinity of the fixing surfaces 17 of the base. Therefore, cracks generated on the surfaces of the optical fiber 13 or the vicinity of the fixing surfaces 17 of the base and the like can be prevented.

Particularly, making the depth of the groove 15 deep enough with regard to the width of the same can prevent the adhesive 11 from flowing downwardly, reaching the bottom of the groove 15, and filling up the space 19. Also, if the viscosity of the adhesive 11 is within an appropriate range, it is possible to secure the spaces 19 with more certainty. Furthermore, forming the space-varying part at the lower part of the fixing part with the adhesive 11 in the groove 15 can prevent the flowing of the adhesive 11 downwardly with certainty.

Figure 5:
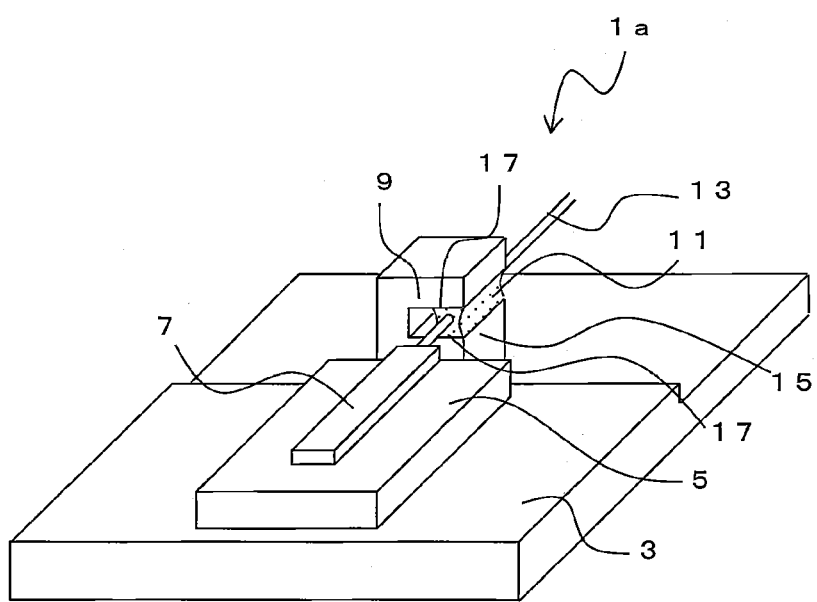
FIG. 5 shows a semiconductor laser module.

Next, another embodiment will be described. FIG. 5 shows a semiconductor laser module 1a according to a second embodiment.

Hereinafter, same notations will be used for those components having the same functions as in the semiconductor laser module 1 and redundant descriptions will be omitted.

The semiconductor laser module 1a has approximately the same structure as the semiconductor laser module 1 except for the forming direction of the groove 15. In the semiconductor laser module 1a, the groove 15 opens toward the side. That is, the fixing surfaces 17 with the adhesive 11 faces each other in a vertical direction. In this case, the spaces 19 are formed on the horizontal direction that is the opening side of the groove 15 and the side opposite to the opening of the groove 15. Even in this case, the spaces are formed in both directions that are perpendicular to the fixing direction of the optical fiber 13 and the fiber-fixing base 9 with the adhesive 11 (the vertical direction in the drawing). Therefore, the same effects can be obtained as in the semiconductor laser module 1.

Figure 6:
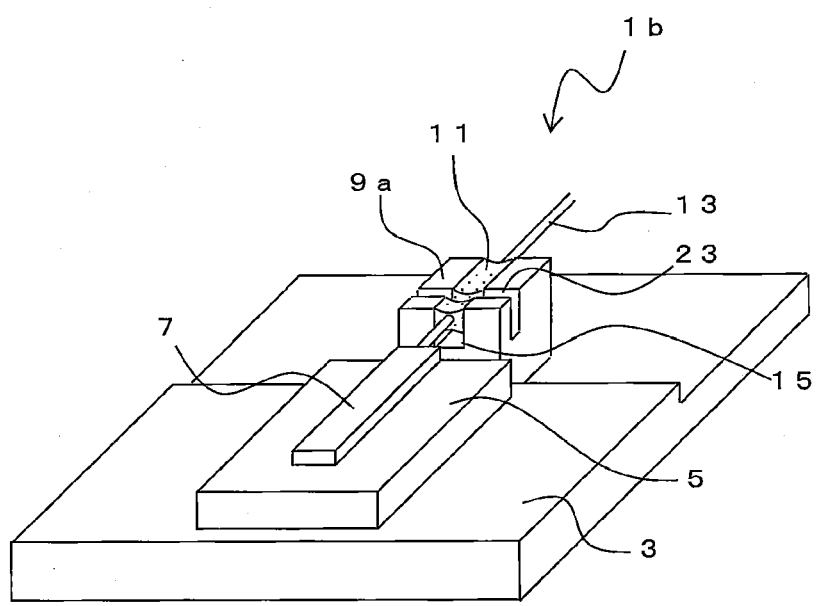
FIG. 6 shows a semiconductor laser module.

Next, a third embodiment will be described. FIG. 6 shows a semiconductor laser module 1b according to the third embodiment. The semiconductor laser module 1b has approximately the same structure as the semiconductor laser module 1 except for the structure of the groove 15. The groove 15 in the semiconductor laser module 1b has a divided part 23 and a plurality of the grooves 15 are provided in the axial direction of the optical fiber 13.

Figure 7:
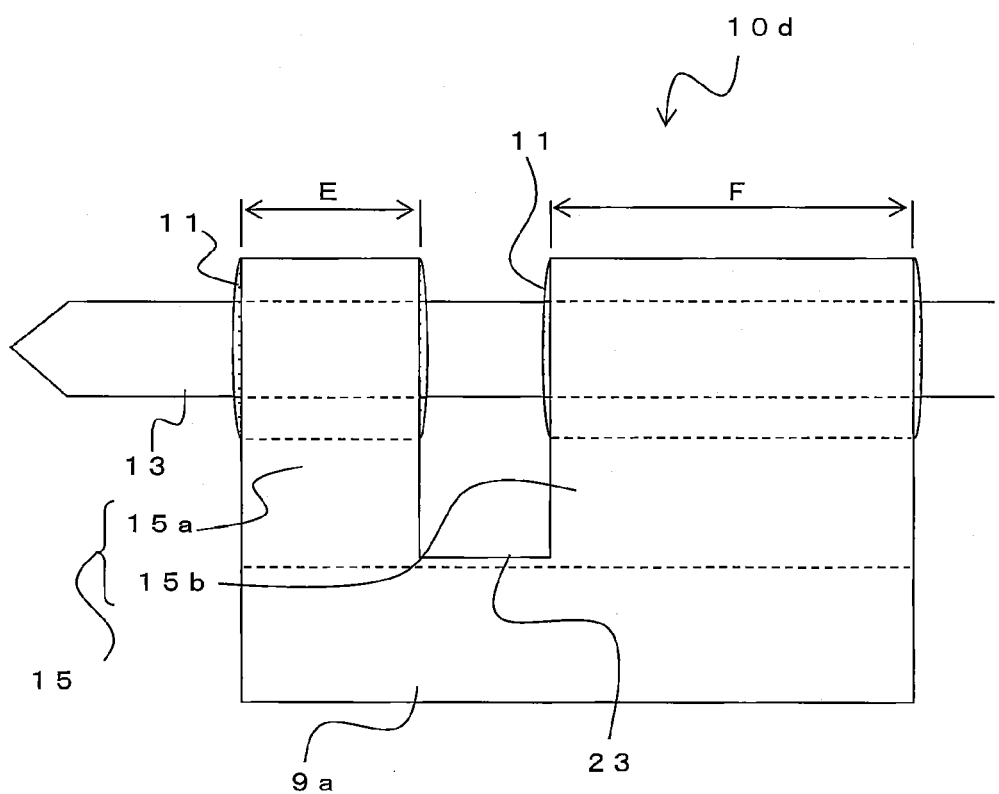
FIG. 7 is a side view showing a fixing structure for an optical fiber.

FIG. 7 shows a fixing structure for an optical fiber 10d in the semiconductor laser module 1b. The groove 15 is provided on the fiber-fixing base 9a of the fixing structure for an optical fiber 10d in the axial direction of the optical fiber 13. Also, the divided part 23, which intersects and divides the groove 15, is provided on the fiber-fixing base 9a. Therefore, the groove 15 is divided into a groove 15a and a groove 15b.

The length E (the length in the axial direction of the optical fiber 13) of the groove 15a, which is on the tip-side of the optical fiber 13 (on the side of the semiconductor laser), is shorter than the length F of the groove 15b, which is on the far side from the tip of the optical fiber 13. In both of the grooves 15a and 15b, the optical fiber 13 is fixed onto the fiber-fixing base 9a with the adhesive 11 at the fixing surfaces 17 that face each other, and the spaces 19 are formed on the each side of the intersecting vertical direction.

Such a fixing structure for an optical fiber 10d is manufactured as below. First, as shown in FIG. 6, the semiconductor laser base 5 and the fiber-fixing base 9a are fixed onto the base 3, and then the semiconductor laser 7 is fixed onto the semiconductor laser base 5. Next, the optical fiber 13 is disposed in the groove 15 (grooves 15a and 15b) of the fiber-fixing base 9a. At this time, the adhesive is applied only to the groove 15a.

After the position of the optical fiber 13 is adjusted to complete the alignment with the semiconductor laser 7, the adhesive 11 in the groove 15a is cured by heat, ultra-violet ray, or the like. After the adhesive 11 in the groove 15a is cured and the optical fiber 13 is fixed in the groove 15a, the adhesive 11 is applied onto the groove 15b. Since alignment of the optical fiber 13 is completed at this state, the adhesive 11 in the groove 15b is cured instantly.

The optical fiber 13 is fixed to the fiber-fixing base 9 in two steps with the grooves 15a and 15b as above because of the following reason. There may be a possibility that force such as tension from the rear is given to the optical fiber after it is fixed to the fixing base 9. Therefore, a fixing strength (bonding strength) to a certain extent is required. Therefore, a bonding area for the optical fiber 13 and the fiber-fixing base 9a (the groove 15) is required. However, the larger the bonding area, the more amount of the adhesive 11 is used, causing the difficulty in aligning the optical fiber 13 and also increasing the influence by the contraction of the adhesive 11.

So, in the fiber fixing structure for an optical fiber 10d, firstly, the optical fiber 13 is fixed to the groove 15a at the position close to the tip thereof. Since the length of the groove 15a is short, the amount of the adhesive used is small, making the alignment easier. Also, small amount of the adhesive 11 and the short bonding length can reduce the influence by the contraction of the adhesive 11. Therefore, the accuracy of the positioning of the optical fiber 13 can be improved further.

Then, after fixing the optical fiber 13 to the groove 15a, the optical fiber 13 is fixed to the groove 15b, of which the length is shorter than that of the groove 15a. On this occasion, since the position of the tip-side of the optical fiber 13 does not move, the influence by the contraction of the adhesive 11 is small. Also, since the groove 15b is long, enough bonding area can be secured between the optical fiber 13 and the fiber-fixing base 9a. Therefore, the fixing strength of the optical fiber 13 can be secured.

In order to fully exhibit the above-mentioned function, the length E of the groove 15a is preferably less than half, or more preferably the third, of the length F of the groove 15b.

Thus, the same effects can be obtained from the fixing structure for an optical fiber 10d as the fixing structure for an optical fiber 10. Also, while securing the fixing strength for the optical fiber 13, the workability of the aligning operation of the optical fiber 13 can be improved, preventing the position-shifting of the optical fiber 13 furthermore.

Figure 8A:
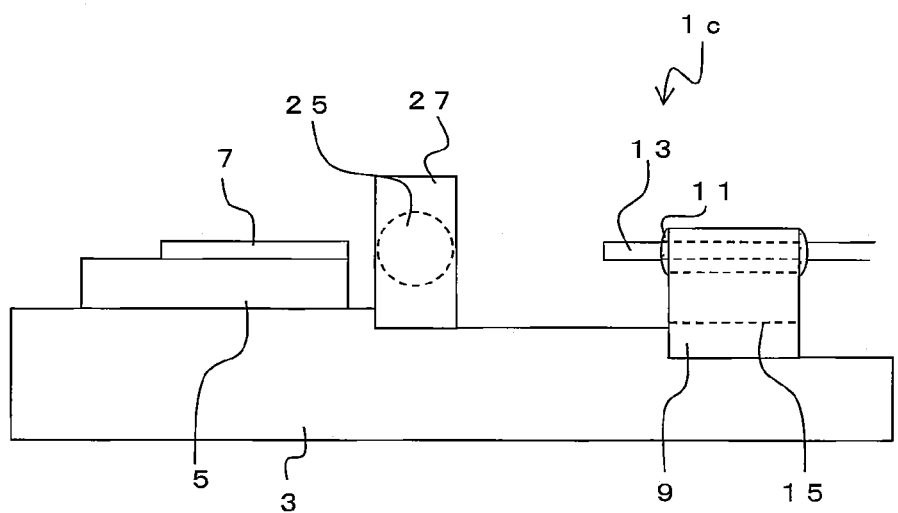
FIG. 8 (a) shows a semiconductor laser module.
Figure 8B:
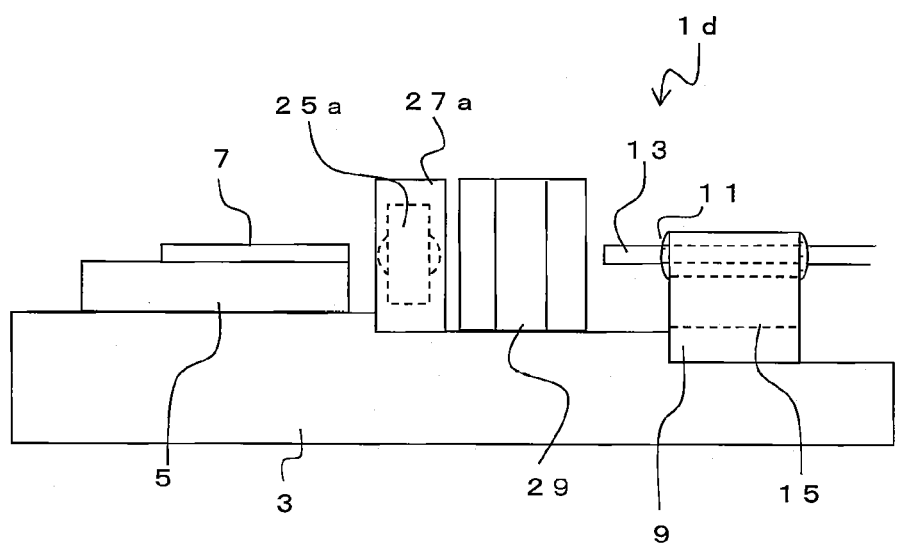

Next, a fourth embodiment will be described. FIG. 8 (a) shows a semiconductor laser module 1c according to the fourth embodiment. The semiconductor laser module 1c has the approximately same configuration as the semiconductor laser module 1 except for a lens 25 which is provided between the tip of the optical fiber 13 and the semiconductor laser 7.

The lens 25 is, for example, a spherical lens. A lens holder 27 holds the lens 25. The lens holder 27 is fixed onto the base 3. A flat or slant polished tip can be used for the tip of the optical fiber 13, for example. In this way, the optical fiber 13 and the semiconductor laser 7 can be optically coupled via the lens 25.

Furthermore, like a semiconductor laser module 1d shown in FIG. 8 (b), a lens 25a and an isolator 29 may be provided between the optical fiber 13 and the semiconductor laser 7. Also, a spherical lens or an aspherical lens can be used as the lens 25a. A lens holder 27a holds the lens 25a. Also, the lens holder 27a and the isolator 29 are fixed onto the base 3. The isolator 29 prevents the incident light from reflecting back. In this way, the optical fiber 13 and the semiconductor laser 7 are optically coupled via the lens 25a and the isolator 29. Although the examples in which the lens 25, lens 25a and the like are disposed in the semiconductor laser module 1 are shown in FIG. 8 (a) and (b), this can be applicable to other semiconductor laser module as well.

The effects of the described embodiments are evaluated. The aligning shifting after alignment of the semiconductor laser module shown in FIG. 1(a) is measured. The method for the measurement is to measure the change in light intensity from the processes of curing of the adhesive after the alignment onward, which is detected by a photo detector connected to the optical fiber. The results are shown in FIG. 9.

Figure 9:
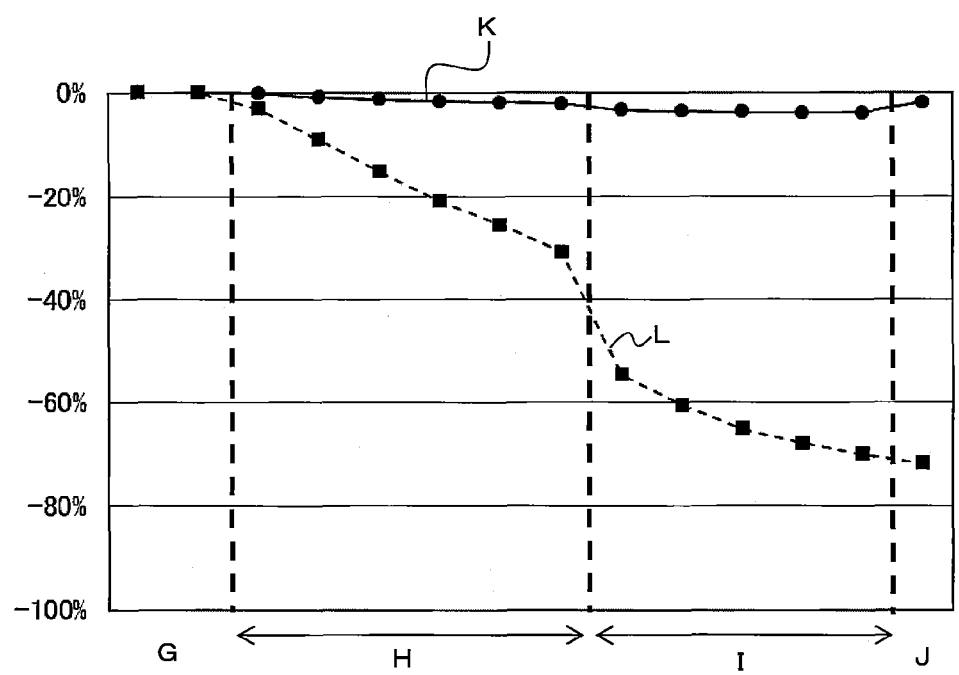
FIG. 9 shows the change in optical intensity during the manufacturing process.
Figure 10:
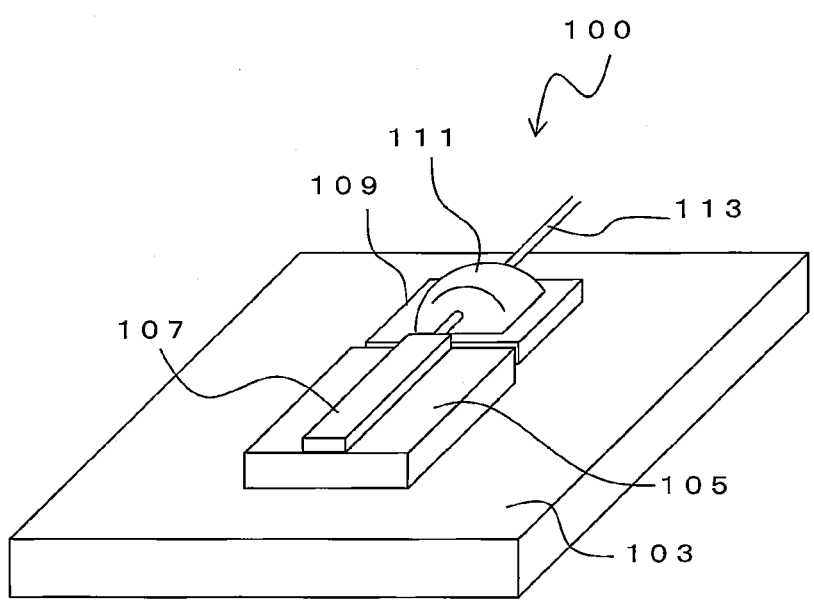
FIG. 10 shows a conventional semiconductor laser module.

The polygonal line K in FIG. 9 is for the semiconductor laser module according to an embodiment (the structure shown in FIG. 1 (a)) and the polygonal line L is for a comparative example (the structure in FIG. 10). In embodiments, Borosilicate glass (product name: Tempax) is used as the material for the base and the groove width of the base is 0.25 mm. The diameter of the optical fiber used is 0.125 mm. The similar effects can be obtained by using a thin diameter fiber with a diameter of 0.080 mm, though the results are omitted. For the adhesive, epoxy UV curing resin is used. The adhesive is adhered to the optical fiber which is then placed into the groove, but the same results are obtained when a small amount of adhesive is poured in from the upper side of the groove and then the optical fiber is placed in the groove afterwards.

The horizontal axis of the graph shows the manufacturing processes and the vertical axis shows the rate of change in light intensity. G in the graph is the light intensity after the alignment, which is set to be a standard. H in the graph is the process of irradiating ultraviolet rays to the adhesive, and data is collected every 10 seconds of the irradiation. I in the graph is the subsequent leaving process and the data is collected every 60 seconds. The adhesive is cooled down in the leaving process. Also, J in the graph is for releasing the chuck which has been holding the optical fiber.

Figure 11A:
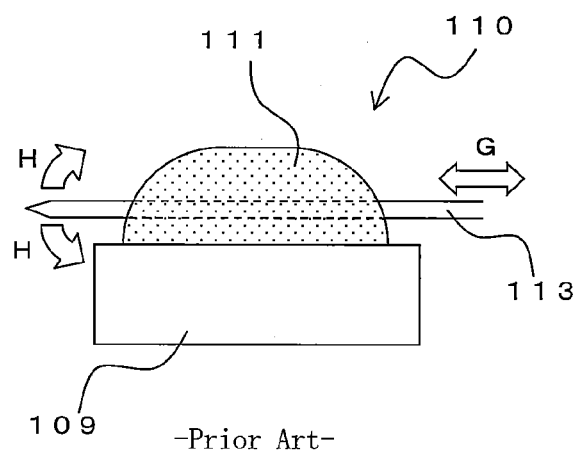
FIG. 11 (*a*) is a side view showing a conventional fixing structure for an optical fiber.
Figure 11B:
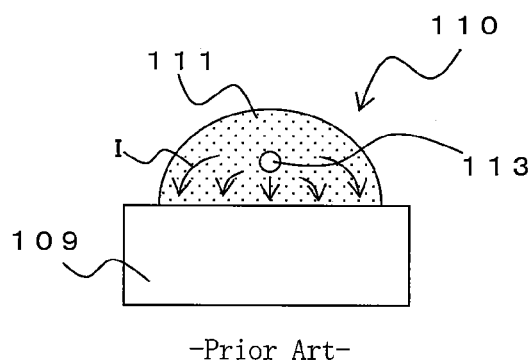
Figure 12A:
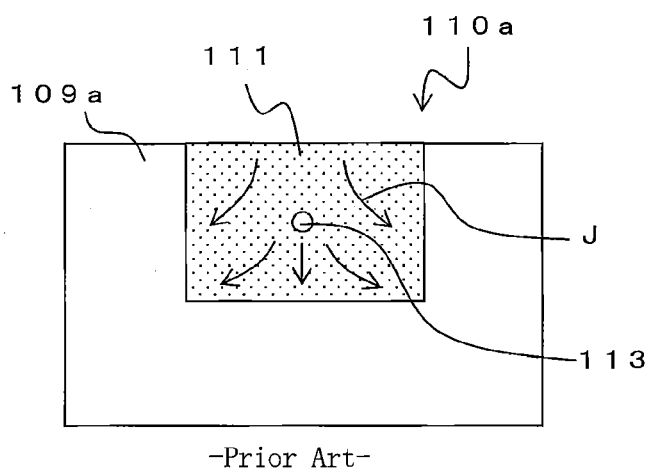
FIG. 12 (*a*) is a front view of a conventional fixing structure for an optical fiber.
Figure 12B:
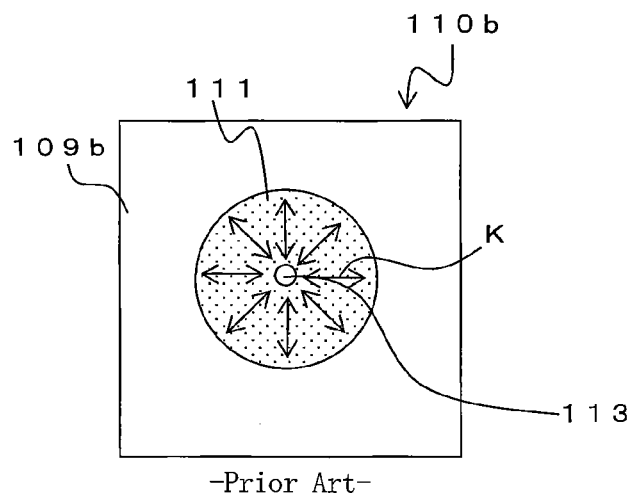

As clearly shown in the graph, light intensity of the comparative example L decreases greatly when the adhesive is cured. This can be considered as the optical fiber is pulled downward due to contraction of the adhesive (FIG. 11 (b)). On the other hand, the change in light intensity of K is small. This is because the shifting of the optical fiber is prevented, and the effects can be verified.

Although embodiments have been described referring to the attached drawings, the technical scope of the disclosure is not limited to the embodiments described above. It is obvious that persons skilled in the art can think out various examples of changes or modifications within the scope of the technical idea disclosed in the claims, and it will be understood that they naturally belong to the technical scope of the present disclosure.

What is claimed is:

1. A fixing structure for an optical fiber comprising:
a fiber-fixing base made of a transparent material; and
an optical fiber fixed with a fixing member to the fiber-fixing base and optically coupled to a semiconductor laser wherein,
a groove is formed on the fiber-fixing base along the axis direction of the optical fiber;
the width of the groove is approximately between 200 μm and 500 μm;
the optical fiber is fixed by an adhesive to fixing surfaces that are inner sides of the groove facing substantially parallel to each other with the fixing member;
space parts, in which the optical fiber is not fixed to the fiber-fixing base, are formed on both directions that are approximately perpendicular, when viewed from the axial direction of the optical fiber, to the fixing direction of the optical fiber and the fixing surfaces, and
wherein the adhesive is arranged within the groove and about the optical fiber to contract upon curing symmetrically in a vertical direction and a horizontal direction.

2. The fixing structure for an optical fiber according to claim 1, wherein
the groove is formed on a upper surface of the fiber-fixing base; and
a space-varying part is formed on the bottom side of the groove, the space-varying part having a space varied from the space between the two fixing surfaces at the part in which the optical fiber is fixed.

3. The fixing structure for an optical fiber according to claim 1, wherein
a plurality of the grooves are provided along the axial direction of the optical fiber; and
the length of the groove which is on the near side of the tip of the optical fiber is shorter than the length of the groove which is on the far side of the tip of the optical fiber.

4. A semiconductor laser module having the fixing structure for an optical fiber according to claim 1, comprising:
a base;
the fixing structure for an optical fiber provided on the base;
the semiconductor laser that is optically coupled with the optical fiber in the fixing structure for an optical fiber.

5. The semiconductor laser module according to claim 4 wherein,
a lens and an isolator are provided between the semiconductor laser and the optical fiber.

6. The fixing structure for an optical fiber according to claim 1, wherein:
the groove is formed on a side surface of the fiber-fixing base;
the fixing surfaces face each other in a vertical direction; and
the space parts are formed on a horizontal direction that is an opening side of the groove and the side opposite to the opening of the groove.

7. A method for fixing an optical fiber, comprising the steps of:
disposing the optical fiber optically coupled to a semiconductor laser in a groove of a fiber-fixing base made of a transparent material having the groove, wherein the width of the groove is approximately between 200 μm and 500 μm;
applying an adhesive fixing member between the optical fiber and fixing surfaces that are inner sides of the groove facing substantially parallel to each other;
curing the fixing member to fix the optical fiber to the fiber-fixing base, wherein
the optical fiber is fixed so that space parts, in which the optical fiber is not fixed to the fiber-fixing base, are formed on both directions that are approximately perpendicular, when viewed from the axial direction of the optical fiber, to the fixing direction of the optical fiber and the fixing surfaces, and
wherein the adhesive fixing member is arranged within the groove and about the optical fiber to contract upon curing symmetrically in a vertical direction and a horizontal direction.

8. The method for fixing an optical fiber according to claim 7, wherein
a plurality of the grooves are provided along the axial direction of the optical fiber; and
the length of a first groove which is on the near side of the tip of the optical fiber is shorter than the length of a second groove which is on the far side of the tip of the optical fiber, the method comprising the steps of:
applying the fixing member between the optical fiber and the fixing surfaces of the first groove;
curing the fixing member in the first groove to fix the optical fiber to the fiber-fixing base;
applying the fixing member between the optical fiber and the fixing surfaces of the second groove; and
curing the fixing member in the second groove to fix the optical fiber to the fiber-fixing base, wherein
the optical fiber is fixed in the first groove and the second groove so that space parts, in which the optical fiber is not fixed to the base, are formed on both directions that are approximately perpendicular, when viewed from the axial direction of the optical fiber, to the fixing direction of the optical fiber and the fixing surfaces.

* * * * *